United States Patent [19]

Jarwala et al.

[11] Patent Number: 5,048,021
[45] Date of Patent: Sep. 10, 1991

[54] METHOD AND APPARATUS FOR GENERATING CONTROL SIGNALS

[75] Inventors: Najmi T. Jarwala, Plainsboro; Paul W. Rutkowski, Morris Plains, both of N.J.; Chi W. Yau, Holland, Pa.

[73] Assignee: AT&T Bell Laboratories, Murray Hill, N.J.

[21] Appl. No.: 399,132

[22] Filed: Aug. 28, 1989

[51] Int. Cl.$^5$ .......................................... H04B 17/00
[52] U.S. Cl. .................................................. 371/22.3
[58] Field of Search ................. 371/22.3, 34; 364/717, 364/715.01, 715.09, 715.10, 715.11

[56] References Cited

U.S. PATENT DOCUMENTS

| | | | |
|---|---|---|---|
| 3,964,088 | 6/1976 | Ducrocq et al. | 364/200 |
| 4,361,896 | 11/1982 | Garner | 364/715.1 |
| 4,366,393 | 12/1982 | Kasuya | 371/22.3 |
| 4,729,093 | 3/1988 | Mothersol et al. | 364/200 |
| 4,774,681 | 9/1988 | Frisch | 364/717 |
| 4,785,410 | 11/1988 | Hamatsu et al. | 364/717 |
| 4,831,570 | 5/1989 | Abiko | 364/715.01 |
| 4,894,830 | 1/1990 | Kawai | 371/22.3 |
| 4,961,191 | 10/1990 | Nakagawa et al. | 371/22.1 |
| 4,965,800 | 10/1990 | Farnbach | 371/22.1 |

FOREIGN PATENT DOCUMENTS 2195185  3/1988  United Kingdom .

OTHER PUBLICATIONS

"Testing and Diagnosis of Interconnects Using Boundary Scan Architecture", A. Hassan, J. Rajski, and V. K. Agarwal, IEEE 1988 International Test Conference Paper 7.1, pp. 126–137 (1988).

"Interconnect Testing with Boundary Scan, P. T. Wagner", IEEE 1987 International Test Conference, Paper 2.2, pp. 52–57 (1987).

"Electronic Chip-In-Place Test", P. Goel and M. T. McMahon, 1982 IEEE Test Conference, Paper 3.6, pp. 83–89 (1982).

IEEE P1149.1 Standard Test Access Port and Boundary Scan Architecture Standard Proposal (draft Jun. 20, 1989).

Primary Examiner—Jerry Smith
Assistant Examiner—Phung Chung
Attorney, Agent, or Firm—Robert B. Levy

[57] ABSTRACT

A method is disclosed for generating a control signal (TMS) which may be used to control the test activity of boundary scan system (10). The method is initiated by loading a multi-bit control macro (STI, DTI or DSTI) into a register (38) whose output is coupled back to its input. After loading of the macro, its identity is ascertained by a macro controller (42) which serves to decode a multi-bit signal (IT) whose state is indicative of the macro type. The macro controller (42) actuates the register to shift out the bits of the control macro in a sequence dependent on the macro's identity in order to generate the appropriate control signal. As each bit is shifted out, it is shifted back into the register so as to allow the same sequence of bits to be repeatedly shifted out.

12 Claims, 2 Drawing Sheets

METHOD AND APPARATUS FOR GENERATING CONTROL SIGNALS

TECHNICAL FIELD

This invention relates to a method and apparatus for generating a control signal useful for controlling the test activity of a system having a boundary scan test architecture.

BACKGROUND OF THE INVENTION

The present trend in the electronics industry is toward increasing the functionality of circuit boards by packing an ever-increasing number of surface-mounted components on the board. The increasing functionality of each board, resulting from the dense packing of surface-mounted components, has made testing of the board by conventional techniques ever more difficult. For this reason, the Institute of Electronic and Electrical Engineers (IEEE) is presently considering a standard (P 1149.1) for testing circuit boards by a technique known as boundary scan. The IEEE P1149.1 proposal is substantially identical to the boundary scan architecture adopted by the Joint Test Action Group (JTAG) of Europe and North America which is described in the document *JTAG Boundary Scan Architecture Version 2.0*, published in March, 1988, herein incorporated by reference.

In accordance with the JTAG and IEEE boundary scan architecture proposals, individual boundary scan cells in a device (i.e., an integrated circuit) are serially linked to establish a boundary scan register. Under the control of a test access port (TAP) controller in each device, each bit of an externally generated test vector TDI is shifted into a successive one of the cells. Thereafter, the bit in each "output" cell (i.e., a cell whose output is fed to another cell) is applied to each "input" cell (i.e., a cell whose input is coupled to an output cell). The bit at the input of each input cell is captured (i.e., retained in place of the bit originally shifted into the cell). After the bits are captured, the bits are shifted out of all of the cells and are compared to the bits in a vector expected to be produced when no faults are present. Any deviation indicates a faulty connection between cells.

The TAP controller in each device is a sixteen-state, finite state machine which is controlled by a test mode select (TMS) control signal applied to the controller. By applying a TMS signal having a particular bit pattern, the TAP controller can be shifted through its sixteen states to initiate the application and capture of the bits of the test vector TDI as well as other operations. A large majority of the sixteen states of the TAP controller are entered into and remain active during an interval of fixed duration corresponding to the period between successive pulses (clock cycles) of a periodic clock signal. However, several of the sixteen states of the TAP controller remain active during several clock cycles. For example, when test data movement takes place, the TAP controller remains in a shift state for several clock cycles. Similarly, the TAP controller can remain in a pause state for several clock cycles.

At the present time, there are two proposed methods for generating the particular bit sequences of the TMS signal needed to step or shift the TAP controller through its sixteen states. The first approach is to provide a random access memory (RAM) for storing the required bit sequences. This approach affords great flexibility since any arbitrary sequence of bits can be output by appropriately addressing the corresponding RAM location in which the segment is stored. The disadvantage of this approach is that the RAM required to store the bit sequences adds to the overall boundary scan circuitry cost. Another approach to generating the TMS signal bit sequences is to provide a finite state machine. Such a finite state machine may require less circuitry but offers less flexibility. With a finite state machine, only a limited number of predetermined bit sequences can be generated.

Thus, there is a need for a technique for generating control signal bit sequences which affords high flexibility, yet can be practiced without the requirement of extensive circuitry.

SUMMARY OF THE INVENTION

Briefly, in accordance with the invention, a technique is provided for supplying predetermined bit-sequences of a control signal. The technique is initiated by loading a multi-bit control macro or binary word into a register whose output is fed back to its input. After the control macro is loaded, its identity is ascertained. The bits of the control macro are shifted in a predetermined sequence out of the register in accordance with the identity of the macro. As each bit is shifted out, the bit is simultaneously shifted into the register so that the bits comprising the control macro can be repeatedly shifted out as necessary.

DETAILED DESCRIPTION

Boundary Scan Architecture

Figure 1:
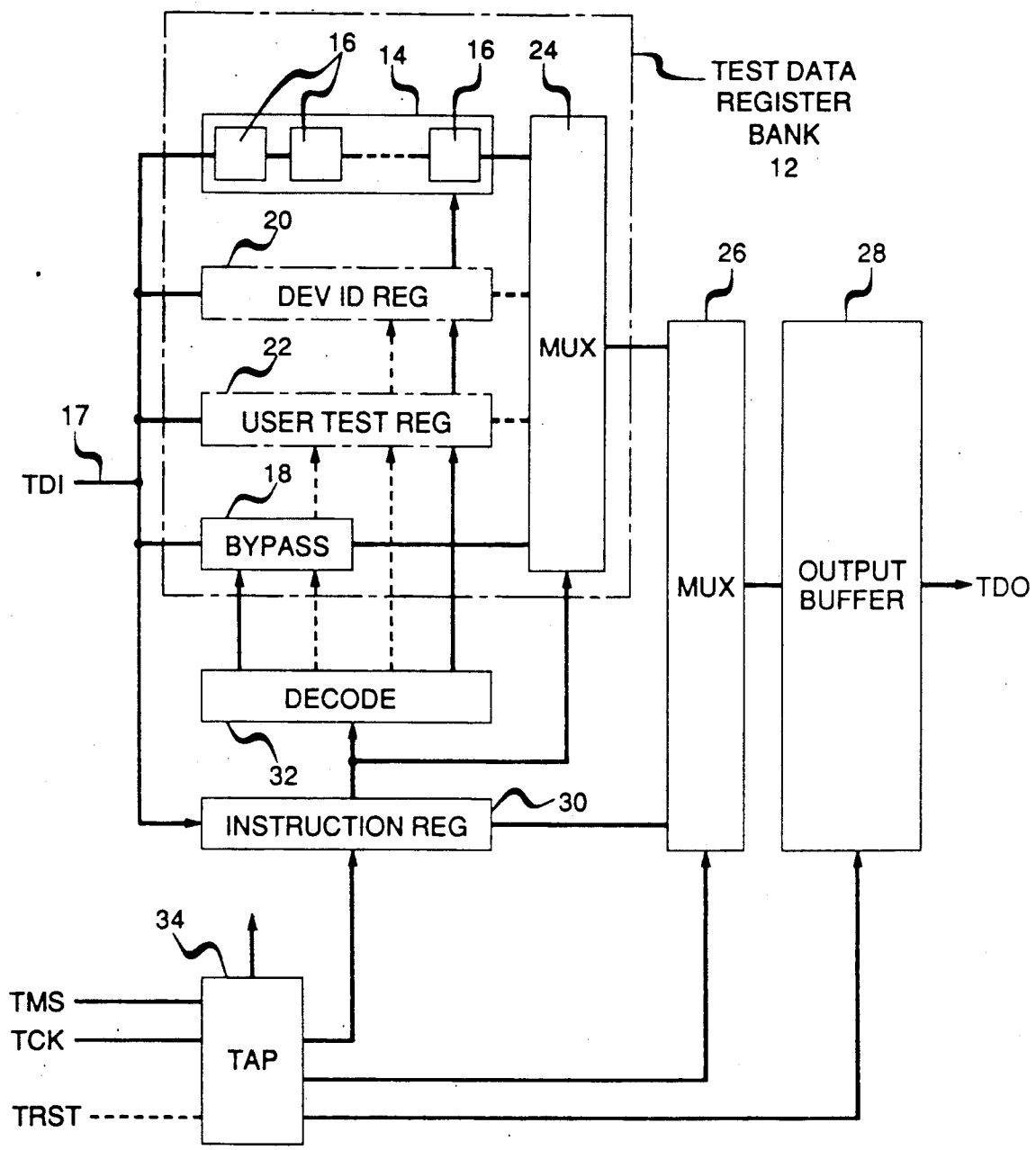
FIG. 1 is block schematic diagram of a boundary scan architecture which requires a TMS control signal for its operation.

Before proceeding to describe the details of the invention, a brief description of the IEEE P1149.1 boundary scan architecture, shown in schematic form in FIG. 1, will prove helpful. The overall boundary scan architecture implemented on a given device (not shown) is referred to generally by the reference numeral 10 and comprises a test register bank 12, which includes a boundary scan register 14 containing a plurality of individual boundary scan cells or cells 16 serially linked in a chain. When devices (i.e., integrated circuits) containing the boundary scan architecture 10 are mounted on a circuit board (not shown), the cells 16 of different devices are typically serially linked to form a "board level" boundary scan chain.

The serial chain of boundary scan cells 16 is coupled to a bus 17 on which a test vector TDI is placed for shifting through the cells. During boundary scan testing, the bits of the TDI vector are first shifted through the cells 16 so that a separate bit remains at each cell. The bit remaining in each cell 16 is applied to the input of the cell or cells connected to it. The bit applied to each cell 16 is then captured (retained). After the capture step, the bits may be shifted out of the cells 16 to create a test data output (TDO) vector which can be compared to the bits of the expected response vector to ascertain if any of the connections between the cells are faulty.

In addition to the boundary scan register 14, the test register bank 12 includes a bypass register 18. The bypass register 18 serves to bypass or divert the TDI vector away from the boundary scan register 14 during appropriate intervals. Further, the test register bank 12 may optionally include a device identification register 20 and a user test register 22 for storing user selected information. Because of the optional nature of the registers 20 and 22, they are depicted in dashed lines.

The outputs of the registers 14, 18, 20 and 22 are input to a first multiplexer 24 which is associated with the registers, and is thus depicted as being part of the test register bank 12. The output of the multiplexer 24 is supplied to a first input of a multiplexer 26 whose output is buffered by an output buffer 28 to produce the (TDO) vector signal.

The multiplexer 26 has a second input coupled to an instruction register 30 which may be loaded with information (either status or instructions) which is present on the bus 17 that carries the TDI signal to the registers 14 and 18-22. The operation of the boundary scan circuitry 10 is controlled by instructions scanned into the register 30. The contents of the register 30, when decoded by a decoder 32, serve to control the registers 14 and 18-22. When the register 30 is loaded with status information, the contents of the register are passed to the multiplexer 26.

The overall control of the boundary scan system 10 is accomplished by way of a Test Access Port (TAP) controller 34. The TAP controller 34 is a sixteen-state, finite state machine, whose structure and operation is described in detail in the *JTAG Boundary Scan Specification(Version 2.0)*, incorporated by reference herein. The TAP controller 34 is responsive to a multi-bit test mode select (TMS) signal, whose bit sequence establishes the particular state of operation of the controller. The clocking of the TAP controller 34 is determined in accordance with a clock signal (TCK). An optional test reset signal (TRST) may be applied to the TAP controller 34 to asynchronously force the controller into a reset state.

Most of the sixteen states of the TAP controller 34 are entered into, and remain active during a single clock cycle, corresponding to the interval between a pair of successive pulses of the clock signal TCK. However, there are several states of the TAP controller 34 which are active during more than a single clock cycle. For. example, it is often desirable to temporarily suspend the test activity for more than a single clock cycle, such as when a new TDI vector must be prepared for input to the bus 17. Further, the shifting of data and instructions into the test register bank 12 and instruction register 30 is usually carried out over several clock cycles. Also, if a component (not shown) has the internal capability of built-in self-test (BIST), then it is desirable to enter a temporary idle state for several clock cycles while the component executes its built-in self-test operations.

In practice, the rate at which the bits of the test vector TDI can be applied from an external source to the bus 17 may sometimes lag the rate at which the bits on the bus are shifted through the cells 16. Consequently, it is desirable that each transition sequence of the TAP controller 34 must originate from, and terminate in, a stable wait state. The number of clock cycles during which the TAP controller 34 remains in a wait state is not critical. However, the number of clock cycles between successive wait states must be precisely controlled so that the test activity that occurs between wait states (i.e., data transfer) is precisely defined. In accordance with the JTAG and IEEE boundary scan proposals, data transfer must occur only during a shift state of the TAP controller 34 which must usually be sandwiched between two successive wait states.

TMS Generator

To achieve reliable operation of the boundary scan system 10, it is preferable, in accordance with the teachings of the invention, that the TMS bit sequence applied to the TAP controller 34 must take the form of a state transition instruction (STI), a data transfer instruction (DTI) or a data transfer and sample instruction (DSTI). The STI specifies the sequence of state transitions (up to sixteen) that the TAP controller 34 must undergo to shift from one stable wait state to another stable wait state. The DTI specifies the sequence of state transitions that the TAP controller 34 must undergo to shift from a wait state to a shift state, during which, data or instruction bits are transferred to the test register bank 12 or to the instruction register 30. From the shift state, the TAP controller 34 must then shift to a wait state.

The DSTI specifies the number of transitions required for sampling of the data in the cells 16 as provided for under the JTAG and IEEE boundary scan testing technique. To sample the data, it is first necessary for the TAP controller 34 to shift from a wait state to a state during which the bits in the cells 16 are captured (i.e., held). From the capture state, the TAP controller 32 must shift to the shift state during which the captured bits are shifted out, and thereafter shift to another stable wait state.

Figure 2:
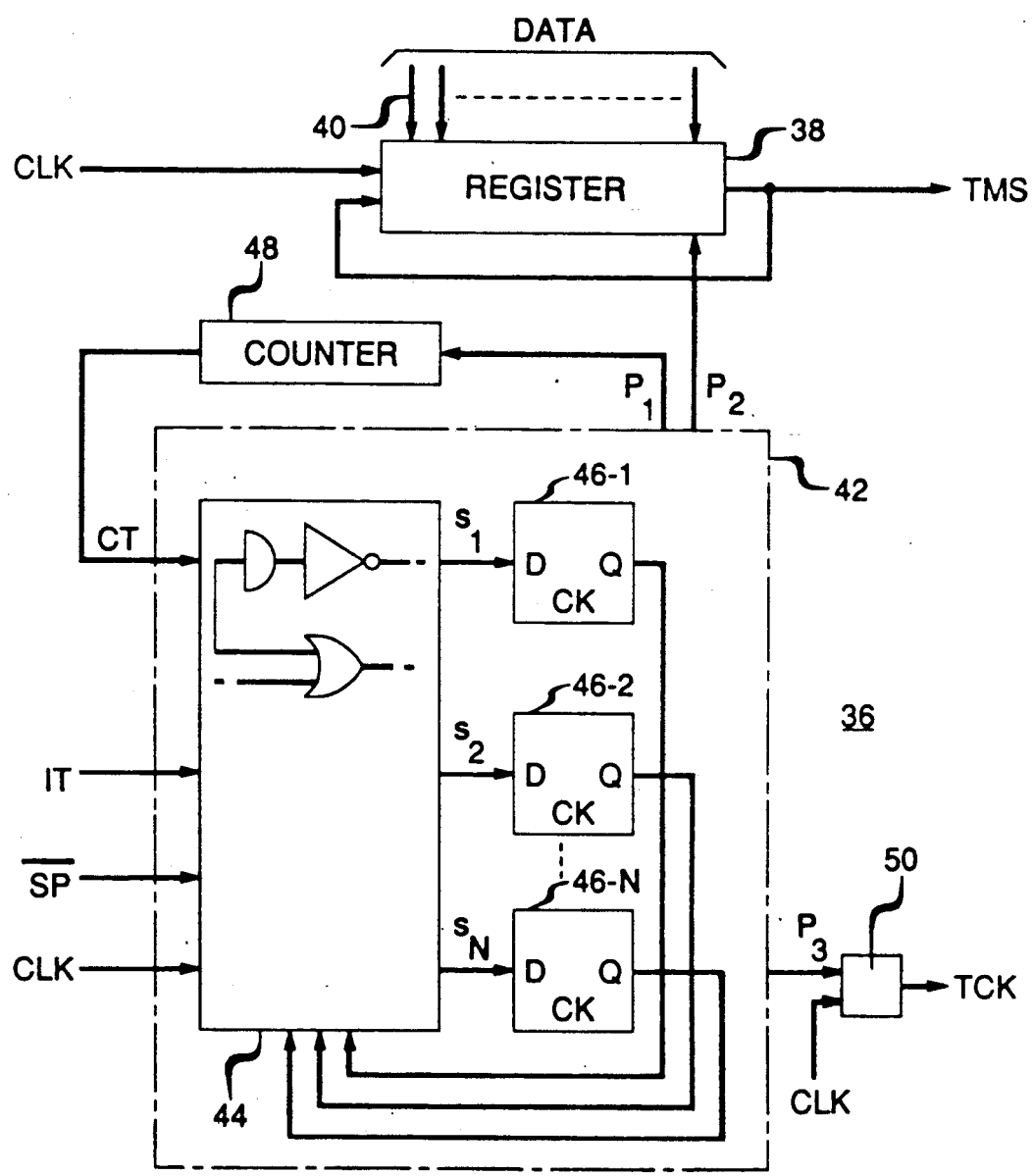
FIG. 2 is a block schematic diagram of a circuit, in accordance with the present invention, for generating the TMS control signal for the boundary scan architecture of FIG. 1.

Referring to FIG. 2, there is shown a schematic diagram of a circuit 36, in accordance with the present invention, for generating the TMS signal applied to the TAP controller 34 of FIG. 1. The generator circuit 36 comprises a TMS macro register 38 for storing a control macro or word, in the form of the STI, DTI or DSTI, which is loaded into the register from an external source via a set of data lines 40. In practice, the register 38 comprises a sixteen-bit circular shift register having its shift output coupled back to a shift input so that as each bit is shifted out, it is shifted back in. Typically, the register is selected to be sixteen bits wide to accommodate an STI, DTI or DSTI which specifies as many as sixteen separate state transitions of the TAP controller 34. In instances where the STI, DTI or DSTI specifies less than sixteen state transitions, the actual sequence must be preceded, or succeeded, by an appropriate number of zeros or ones so that the STI, DTI or DSTI is sixteen bits long. The register 38 sequentially shifts out each of the bits of the STI, DTI or DSTI macro upon each pulse of a periodic clock signal CLK,.for so long as a signal at a set level is asserted on the register's shift control input.

The generator circuit 36 also includes a TMS macro controller 42 for supplying the signal ($P_2$) which is asserted on the shift control input of the register 38, and for supplying the TCK clock signal to the TAP controller 34 of FIG. 1. In practice, the TMS macro controller 42 comprises a finite state machine configured of a combinational logic array 44 and a set of flip-flops 46a, 46b. . . 46n, where n is an integer. The combinational logic array 44 consists of a combination of logic gates (AND, OR, inversion, etc.) which, as will be described later, are supplied with a set of input signals $\overline{SP}$, IT and CT, together with a clock signal CLK, which serves as the required TCK signal for the boundary scan circuit 10 of FIG. 1. The array 44 generates a series of intermediate output signals $s_1, s_2 \ldots s_n$, each supplied to the D input of a separate one of the flip-flops 46a, 46b ... 46n. The output signal of each flip-flop is fed back into the array. In response to the input signals $\overline{SP}$, IT, CT and CLK, and the output signals received from each of the flip-flops 46a, 46b ... 46n, the array produces a set of three signals $P_1$, $P_2$, and $P_3$.

The $P_1$ signal is activated in synchronism with the clock signal CLK and serves to decrement a counter 48 which is loaded with a value representing the number of clock cycles during which the TAP controller 34 should remain in the shift state (during which the bits are shifted into or out of the cells 16 of FIG. 1). The signal $P_2$ serves as the shift control signal, that is, the signal which is applied to the shift input of the register 38 to control the bits shifted by the register. The signal $P_3$ serves to gate the TCK signal received by the boundary scan circuit 10 of FIG. 1. In this regard, the signal $P_3$ is applied to one input of a logic gate 50, typically, an AND gate or multiplexer, whose remaining input is supplied with the CLK signal. While the $P_3$ signal is activated, the CLK signal passes through the gate 50 and is output therefrom as the TCK signal which is received by the boundary scan circuit 10 of FIG. 1.

To understand the relationship between the signals $P_1$, $P_2$, and $P_3$ and the input signals $\overline{SP}$, IT and CT as well as the clock signal CLK, it is necessary to understand the nature of the signals $\overline{SP}$, CT and IT. The signal $\overline{SP}$ is referred to as the sample signal because the signal, when activated, causes the TMS macro controller 42 of FIG. 2 to sample the data during execution of the DSTI macro in the register 38. As will be described, data sampling is initiated by first shifting out a predetermined number of bits (typically 7) of the DSTI macro to shift the TAP controller 34 into the capture state, at which time the TCK signal is inhibited by deactivating the signal $P_3$. When the $\overline{SP}$ signal is activated, the $P_3$ signal becomes activated, at which time the TCK signal to the boundary scan circuit 10 of FIG. 1 is resumed, so that the captured bits in the cells 16 of FIG. 1 are now sampled.

The CT signal is derived from the counter 48 and is reflective of its count which is decremented in synchronism with the CLK signal. As will be recalled, the count of the counter 48 represents the number of clock cycles that the TAP controller 34 is to remain in a shift state. Thus, the CT signal alerts the TMS macro controller 42 how long the signal $P_2$ should be negated so that the TAP controller 34 can be held in a shift state.

The input signal IT (typically two bits wide) designates the type of TMS macro loaded into the register 38, that is, whether the macro is a STI, DTI or DSTI as described above. Knowledge of the particular TMS macro type aids the TMS macro controller 42 in generating the $P_2$ signal, which, as described previously, acts as the shift control signal for the register 38 as well as the $P_1$ and $P_3$ signals. When the TMS macro is an STI, as reflected by the IT signal being a binary "00" or 01, the $P_2$ signal applied to the register 38 must be asserted for sixteen consecutive clock cycles. This causes the sixteen bits of the TMS macro to be sequentially shifted to the TAP controller 34 of FIG. 1 to step it through sixteen state transitions.

When the TMS macro is a DTI, as reflected by the IT signal being a binary "10," the $P_2$ signal applied to the register 38 must be asserted initially for typically nine clock cycles. In this way, the first nine bits of the TMS macro in the register are shifted out to step the TAP controller 34 of FIG. 1 from a wait to a shift state during which data or instructions are transferred. The $P_2$ signal is then negated for a requisite number of clock cycles, as established by the count in the counter 48, to hold the TAP controller 34 in the shift state in order for data/instruction transfer to be completed. After all of the data or instructions have been shifted, then the $P_2$ signal is asserted for another seven clock cycles to enable the remaining seven bits of the TMS macro to be shifted out to step the TAP controller 34 to another wait state.

Should the TMS macro be a DSTI, as reflected by the IT signal being a binary "11," it is then necessary to first assert the $P_2$ signal for a period of typically eight clock cycles to sequentially shift out the first eight TMS macro bits to step the TAP controller 34 to the capture state, at which point the signal $P_3$ is deactivated to temporarily inhibit the TCK signal supplied to the TAP controller to hold it in its capture state. When the $\overline{SP}$ signal is activated, the $P_3$ signal is once again activated, at which time the bits in the cells 16 of FIG. 1 are captured. Thereafter the TAP controller 34 is stepped to its shift state, during which time the bits in the cells 16 are shifted out. During the shift state, the signal $P_2$ is deactivated in accordance with the count of the counter 48. Once the bits are shifted out of the cells 16, the signal $P_2$ is then activated for an additional number of clock cycles (typically 7) to shift the remaining bits of the TMS macro out of the register 38 to shift the TAP controller to a wait state.

Having now detailed the relationship between the input signals CT, IT and $\overline{SP}$ and the output signals $P_1$, $P_2$ and $P_3$, well-known techniques can easily be employed to appropriately configure the circuit 42 to establish the desired relationship. For a more detailed description of the design of finite state machines, reference should be had to the text *Fundamentals of Logic Design* by C. H. Roth, herein incorporated by reference.

The foregoing describes a technique for generating a control signal by loading a control macro into a register (38) and then shifting out a portion of the macro pursuant to its type, such that as each bit is shifted out, it is shifted back into the register. This approach offers a great deal of flexibility since the macro in the register can be repetitively shifted out by virtue of the fact that as each bit is shifted out, it is shifted back in. Further, this approach can be implemented without the need for any additional memory circuits.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for generating selected bit sequences of a control signal for controlling a controller comprising the steps of:
   loading a multi-bit control macro of a particular type into a register having its shift output coupled to its shift input;
   identifying the type of macro loaded in the register;
   shifting out the bits of the control macro to a controller in a sequence established in accordance with the macro's identity; while simultaneously shifting back into the register each bit which is shifted out.

2. The method according to claim 1 wherein the bits of the control macro are shifted out at a preselected rate.

3. The method according to claim 2 wherein the bits are shifted out sequentially one after another without interruption until all the bits have been shifted out.

4. The method according to claim 2 wherein the bits of the control macro are shifted out sequentially in groups, such that a lag occurs between the shifting of the bits in one group and another group.

5. The method according to claim 1 wherein the identity of the control macro is ascertained by decoding a multi-bit input signal whose state varies in accordance with the type of macro loaded into the register.

6. A technique for generating a multi-bit test control signal for controlling a controller which controls the test operation of a system having a boundary scan architecture comprising the steps of:
   loading a multi-bit register with a separate one of three possible control macros, each initiating a separate one of three types of operations;
   decoding an input signal, indicative of the macro type, to identify the type of macro loaded into the register;
   sequentially shifting out to the controller at a preselected rate, at least a portion of the macro bits, in accordance with the identity of the macro, while simultaneously shifting back into the register each bit which has been sequentially shifted out.

7. The method according to claim 6 wherein when a first type of macro is loaded in the register, all of the bits of the macro are sequentially shifted out without interruption.

8. The method according to claim 6 wherein when each of a second and a third types of macros are separately loaded in the register, a group of less than all of the bits of each respective macro is shifted out without interruption.

9. Apparatus for generating predetermined bit sequences of a control signal comprising:
   a register for storing a multi-bit control macro of a particular type, the register having its output coupled back to its input; and
   a macro controller, responsive to an input signal indicative of the type of the macro loaded into the register, for controlling the register in accordance with said input signal so that the bits of the stored control macro are shifted out in a predetermined sequence.

10. The apparatus according to claim 9 further including a counter for signaling the macro-controller when a predetermined interval has elapsed between the shifting out of bits from the register.

11. The apparatus according to claim 9 wherein the macro controller comprises:
   a logic circuit configured to generate at least one control signal for controlling the register in accordance with the state of said input signal whose state specifies the identity of the control macro loaded into the register.

12. The invention according to claim 11 wherein the logic circuit also generates a second control signal for gating a clock signal.

* * * * *